United States Patent
Hokazono et al.

(10) Patent No.: US 6,927,459 B2
(45) Date of Patent: Aug. 9, 2005

(54) SEMICONDUCTOR DEVICE HAVING A GATE ELECTRODE WITH A SIDEWALL INSULATING FILM AND MANUFACTURING METHOD THEREOF

(75) Inventors: Akira Hokazono, Sagamihara (JP); Mariko Takayanagi, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 57 days.

(21) Appl. No.: 10/364,411

(22) Filed: Feb. 12, 2003

(65) Prior Publication Data

US 2003/0141551 A1 Jul. 31, 2003

Related U.S. Application Data

(62) Division of application No. 09/892,574, filed on Jun. 28, 2001, now Pat. No. 6,545,317.

(30) Foreign Application Priority Data

Jun. 30, 2000 (JP) ........................................ 2000-199627

(51) Int. Cl.$^7$ ............................................. H01L 29/76
(52) U.S. Cl. ................. 257/368; 257/336; 257/333; 257/344; 257/408; 257/412; 438/207; 438/218; 438/199; 438/299; 438/300
(58) Field of Search ................. 257/368, 336, 257/333, 344, 408, 412; 438/207, 218, 199, 299, 300

(56) References Cited

U.S. PATENT DOCUMENTS

| 5,989,978 A | * 11/1999 | Peidous ...................... 438/436 |
| 5,998,273 A | 12/1999 | Ma et al. |
| 6,043,545 A | 3/2000 | Tseng et al. |
| 6,153,480 A | * 11/2000 | Arghavani et al. .......... 438/296 |
| 6,162,691 A | 12/2000 | Huang |
| 6,190,976 B1 | 2/2001 | Shishiguchi et al. |
| 6,287,924 B1 | 9/2001 | Chao et al. |
| 6,326,281 B1 | * 12/2001 | Violette et al. ............. 438/413 |

FOREIGN PATENT DOCUMENTS

JP 07193233 A 7/1995

* cited by examiner

Primary Examiner—Nathan J. Flynn
Assistant Examiner—Remmon R. Fordé
(74) Attorney, Agent, or Firm—Finnegan, Henderson, Farabow, Garrett & Dunner, L.L.P.

(57) ABSTRACT

A gate electrode is provided via a gate insulating film formed between the source and drain regions on a semiconductor substrate, wherein the sidewall of the gate electrode excluding the exposed part formed at the upper part thereof facing the source and drain regions is covered with a sidewall insulating film, and an epitaxial film is formed on the exposed part of the sidewall of the gate electrode but not formed on a top surface of the gate electrode. An element isolation region formed on the semiconductor substrate is composed of a first insulating film formed in the semiconductor substrate and a second insulating film which is formed inside the first insulating film and has a lower epitaxial growth rate than that of the first insulating film, and the surface of the source and drain regions is covered with a silicon layer, part of which runs onto the surface of the first insulating film.

20 Claims, 7 Drawing Sheets

SEMICONDUCTOR DEVICE HAVING A GATE ELECTRODE WITH A SIDEWALL INSULATING FILM AND MANUFACTURING METHOD THEREOF

CROSS-REFERENCE TO RELATED APPLICATIONS

This is a division of application Ser. No. 09/892,574, filed Jun. 28, 2001 now U.S. Pat. No. 6,545,317.

This application is based upon and claims the benefit of priority from the prior Japanese Patent Application No. 2000-199627, filed Jun. 30, 2000, the entire contents of which are incorporated herein by reference.

BACKGROUND OF THE INVENTION

1. Field of the Invention

This invention relates to a semiconductor device with a MOS structure and a manufacturing method thereof.

2. Description of the Related Art

The miniaturization of semiconductor devices having a MOS structure, particularly a CMOS structure, has been in progress to meet the demands for higher operation speed and higher performance. This makes it necessary to form not only the low-concentration shallow diffused regions of the source and drain regions in a semiconductor substrate but also the high-concentration diffused regions after the formation of the low-concentration regions so that the high-concentration diffused regions may be of less deep. Making a high-concentration diffused layer less deep, however, causes junction leakage currents due to a silicide layer formed on the high-concentration diffused layer, which also causes a power consumption problem.

To reduce the power consumption, the approach of forming a monocrystalline silicon layer on only the source and drain diffused regions, or on these diffused layers and the gate electrode to make the high-concentration diffused layer less deep has been proposed. With this approach, junction leakage currents resulting from the silicide layer can be suppressed. The structure where monocrystalline silicon is selectively formed on only the diffused layers or on the diffused layers and the gate electrode is called an elevated source-drain (or simply referred to as ESD) structure.

In an example of the process of forming the ESD structure, a gate sidewall insulating film is formed after the formation of a low-concentration diffused layer and silicon monocrystalline growth is performed using hydrogen, dichlorosilane, and hydrogen chloride as gas sources. Then, high-concentration diffused layers are formed from above the monocrystalline silicon layer, thereby producing a MOS device with an ESD structure, for example, a CMOS device. Silicon monocrystalline growth may also be performed after the formation of the high-concentration diffused layers.

In the approach of growing silicon in the conventional ESD-structure CMOS device, there are generally two processes. In a first process, epitaxial silicon growth is performed, with polysilicon (polycrystalline silicon) constituting a gate electrode being exposed. In a second process, epitaxial silicon growth is performed, with polycrystalline silicon constituting a gate electrode not being exposed. Each process, however, has the problems explained below.

FIG. 9 shows an example of the COMS structure formed in the first process.

As shown in FIG. 9, a plurality of well regions 2 are formed at the surface of a silicon substrate 1. The well regions 2 are so formed that they overlap partially with each other. An element isolation insulating film 3 constituting an element isolation region is formed to a specific depth from the surface of the silicon substrate 1 in the overlapping part. In the region on the silicon substrate 1 and excluding the element isolation insulating film 3, that is, in the active region or element forming region, a gate electrode 5 is selectively formed via a gate insulating film 4. On the sidewall of the gate electrode 5, a gate sidewall insulating film 6 is provided.

In the vicinity of the surface of the silicon substrate 1 where neither the gate electrode 5 nor the gate sidewall insulating film 6 is formed, high-concentration diffused layers 7a and 7b are formed so as to sandwich the region directly under the gate electrode 5 between them. These high-concentration diffused layers 7a and 7b extend from the edge of the gate sidewall insulating film 6 to the element isolation insulating film 3. At the silicon substrate 1 surface directly under the gate sidewall insulating film 6 in the region sandwiched between the high-concentration diffused layers 7a and 7b, low-concentration diffused layers 8a and 8b are formed. These low-concentration diffused layers 8a and 8b are formed less deep than the high-concentration diffused layers 7a and 7b.

Silicon films 10 are formed at the surface of the high-concentration diffused layers 7a and 7b on which neither the gate electrode 5 nor the gate sidewall insulating film 6 has been formed. The silicon films 10 are so formed that they extend from the side of the gate sidewall insulating film 6 to the surfaces of the high-concentration diffused layers 7a and 7b and cover part of the surface of the element isolation insulating film 3.

On the top surface of the gate electrode 5, a silicon film 111 is grown. The upper part of the sidewall of the gate electrode 5 is exposed without being covered with the gate sidewall insulating film 6. From this exposed part, a silicon film 111 is also grown. The silicon film 111 is conductive and functions as part of the gate electrode. Thus, this silicon film 111 and gate electrode 5 form a gate electrode structure.

In the CMOS structure formed by the first process, over-etching times generally have to be provided in etching in the process of forming the sidewall insulating film 6 of the gate, taking into account a margin for process in reactive ion etching (RIE). This makes the upper part, or the shoulder part, of the gate sidewall insulating film 6 being lower than the top surface of the gate electrode 5. When epitaxial silicon growth is performed with the lower shoulder part, a problem arises: the gate electrode 5 assumes the structure having a mushroom shape as shown in FIG. 7, since the top surface of the gate electrode 5 and the upper part of its sidewall are exposed.

The mushroom shape of the part acting as the gate electrode structure has the advantage that, even when the gate electrode 5 is a thin wire, the sheet resistance gets lower in proportion to an increase in the length of the gate electrode. At the same time, however, the following problems arise: the silicon film 111 of the gate electrode structure is liable to be short-circuited with the silicon film 10 on the source-drain regions, and the epitaxial growth of the silicon film 111 on the polycrystalline silicon constituting the gate electrode 5 increases its roughness, making the whole sheet resistance higher.

Furthermore, when the gate sidewall insulating film 6 is thin, another problem arises: even when ion implantation is performed, the mushroom-shaped polycrystalline 111 as shown in FIG. 9 acts as a mask, preventing ions from being implanted in the vicinity of the place just under the gate sidewall insulating film 6.

FIG. 10 shows an example of the CMOS structure formed in the second process. FIG. 10 differs from FIG. 9 in that the silicon oxide film 9 is formed as a cap material on the gate electrode 5. In the second process, to prevent silicon from growing epitaxially on the gate electrode 5, epitaxial silicon growth is performed, with the cap material 9 remaining on the gate electrode 5. The second process can avoid the problem of the short-circuiting of the gate electrode 5 with the silicon film 10 of the source-drain region as found in the first process.

Since the polycrystalline silicon on the gate electrode 5 does not grow laterally, this prevents a T-shaped gate structure, an advantage of the ESD structure, from being formed.

As described above, in the conventional ESD structure manufacturing processes, it is difficult to solve not only an ion implantation problem but also the problem of the short-circuiting of the gate electrode structure with the source region or drain region, while realizing a T-shaped gate structure.

Furthermore, in the process of manufacturing a CMOS with the ESD structure, a junction leakage current problem arises, which will be explained below. FIGS. 9A and 9B are sectional views of a MOSFET structure constituting a CMOS to help explain the junction leakage current problem.

Attention should be given to silicon epitaxial growth in the edge region of the element isolation insulating film 3 to realize the suppression of junction leakage currents, so as to realize an advantage of the ESD structure. Specifically, it is desirable that the epitaxially grown silicon film 10 should run onto the element isolation insulating film to some extent (20 nm to 50 nm).

When an isolation band width of the element isolation insulating film 3 gets smaller as a result of further miniaturization, the element forming regions isolated by the element isolation insulating film 3 are liable to be short-circuited and incapable of operating as a device.

Furthermore, it is difficult to control the process of causing the silicon film 10 to run onto the element isolation insulating film 3 about 20 nm to 50 nm, while keeping selectivity. For this reason, it is often that the silicon hardly runs onto the silicon film 10 as shown in FIG. 11A. The same problem arises in the cases of FIGS. 9 and 10.

For instance, when a silicide film 131 is formed on the basis of the silicon film 10 from the structure of FIG. 11A, a silicide reaction might occur at also the sidewall of the epitaxial silicon film 10 in the edge region of the element isolation insulating film 3. For this reason, the silicide film 131 might be formed to a deep position from the surface of the substrate 1 in the edge region of the element isolation insulating film 3 as shown in FIG. 11B. This causes junction leakage currents to flow significantly. That is, this causes a problem in which a merit of using the ESD structure does not produce much effect in the edge region of the element isolation insulating film 3.

As described above, in the process of manufacturing CMOS devices with the conventional ESD structure, it is difficult to realize such a structure as avoids not only an ion implantation problem but also the problem of the short-circuiting of the gate with the source region or drain region, while realizing a T-shaped gate structure.

It is, accordingly, an object of the present invention to provide a semiconductor device with a T-shaped gate structure and a manufacturing method thereof.

Another object of the present invention is to provide a semiconductor device with a silicide film whose shape is highly controllable and a manufacturing method thereof.

BRIEF SUMMARY OF THE INVENTION

According to a first aspect of the present invention, there is provided a semiconductor device comprising: a gate insulating film formed on a semiconductor substrate; a gate electrode formed on the gate insulating film and having a shape defined by a sidewall and a top surface thereof; a sidewall insulating film which is formed on a lower part of the sidewall of the gate electrode excluding an exposed part formed at an upper part of the sidewall of the gate electrode and which is formed on a specific region of the surface of the semiconductor substrate adjacent to the gate electrode; and an epitaxial film formed on the exposed part, the epitaxial film being not formed on the top surface of the gate electrode.

With this configuration, no epitaxial film is formed at the top of the gate electrode, and an epitaxial film is formed horizontally only on the exposed part at the upper part of the sidewall of the gate electrode. This epitaxial film and gate electrode forms a T-shaped gate structure. Such a T-shaped gate structure helps decrease the sheet resistance of the gate electrode.

The top of the gate electrode has no epitaxial film grown, with the result that the gate electrode structure does not take the form of a mushroom as found in the prior art and therefore the silicide layer formed on the source and drain regions is prevented from being short-circuited with the gate electrode structure.

According to another aspect of the present invention, there is provided a semiconductor device comprising: a silicon semiconductor substrate; a groove section formed to a specific depth from a surface of the semiconductor substrate so as to separate the silicon semiconductor substrate into a plurality of regions; an element isolation region which is formed by burying at least a first and second insulating films differing in silicon epitaxial growth rate sequentially in the groove section and which defines element forming regions on the silicon semiconductor substrate; a gate electrode selectively formed on a first region of the element forming region of the silicon semiconductor substrate defined by the element isolation region via a gate insulation film; a source region and a drain region formed in a second region of the element forming region of the surface of the silicon semiconductor substrate, the first region being sandwiched between the source region and the drain region; and a silicide film formed so as to cover from the source region and drain region to the first insulating film in the element isolation region of the silicon semiconductor substrate, wherein the first insulating film is made of a material whose silicon epitaxial growth rate is higher than that of the second insulating film.

With this configuration, a silicon film formed on the surface of the source region and drain region runs onto the first insulating layer in the element isolation region, but not onto the second insulating layer. As a result, junction leakage currents do not occur. Moreover, the silicon film is prevented effectively from being short-circuited with a silicon film formed on the transistors made in adjacent element forming regions in the element isolation region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Hereinafter, referring to the accompanying drawings, embodiments of the present invention will be explained. Although the embodiments will be explained using the n-type or p-type conductivity, these conductivity types are interchangeable. Explanation will be given using only one conductivity type for the sake of clarity.

(First Embodiment)

Figure 1:
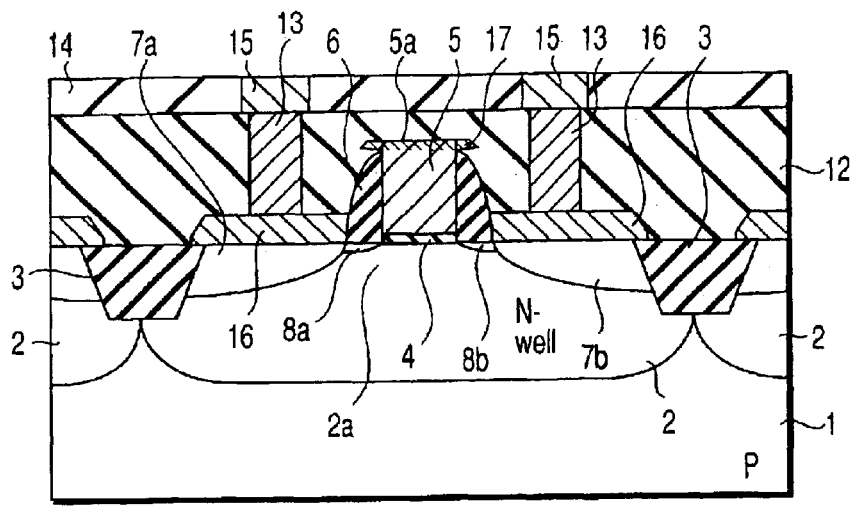
FIG. 1 is a longitudinal sectional view showing the overall configuration of a semiconductor device according to a first embodiment of the present invention.

FIG. 1 is a sectional view showing the overall configuration of a semiconductor device according to a first embodiment of the present invention. As shown in FIG. 1, numeral 1 indicates a p-type silicon substrate. In the silicon substrate 1, a plurality of well regions 2 obtained by diffusing n-type impurities are formed. The well regions 2 are so formed that they overlap with each other. Element isolation regions 3 are formed to a specific depth from the surface of the silicon substrate 1 in the overlapping parts.

A gate electrode 5 is selectively formed via a gate insulating film 4 above the silicon substrate 1 and in an element forming region excluding the element isolation region 3. On the sidewall of the gate electrode 5, a gate sidewall insulating film 6 is provided. In the vicinity of the surface of the silicon substrate 1 where neither the gate electrode 5 nor the gate sidewall insulating film 6 is provided, high-concentration diffused layers 7a and 7b are formed so as to sandwich the region directly under the gate electrode 5 between them. These high-concentration diffused layers 7a and 7b extend from the edge of the gate sidewall insulating film 6 to the element isolation regions 3.

At the surface of the silicon substrate 1 just under the gate sidewall insulating film 6 and in the region sandwiched between the high-concentration diffused layers 7a and 7b, low-concentration diffused layers 8a and 8b are formed. The depth of the low-concentration diffused layers 8a and 8b is less than the depth of the high-concentration diffused layers 7a and 7b.

On the surface of the silicon substrate 1 where neither the gate electrode 5 nor the gate sidewall insulating film 6 is formed, a silicide film 16 is formed. The silicide film 16 is so formed that it extends from the side of the gate sidewall insulating film 6 onto the high-concentration diffused layers 7a and 7b and further covers part of the surface of the element isolation region 3.

The top surface region of the gate electrode 5 is formed as a silicide region 5a. The upper part of the sidewall of the gate electrode 5 is exposed without being covered with the gate sidewall insulating film 6 and the exposed portion is provided with silicide films 17. The silicide films 17 are so formed at exposed parts that they project in both directions of gate length. The height of each of the silicide films 17 in the direction of gate length is 10 nm to 50 nm, preferably 10 nm to 20 nm.

The silicide films 17 are conductive and functions as part of a gate electrode structure. This silicide film 17 and the gate electrode 5 form a T-shaped gate electrode structure.

On the gate electrode structure, silicide films 16, and element isolation regions 3, an interlayer insulating film 12 is formed. In the interlayer insulating film 12, a contact hole reaching the silicide film 16 is made. In the contact hole, a contact plug 13 made of, for example, Ti or TiN or W is formed so as to fill the hole. On the interlayer insulating film 12 and contact plug 13, an interlayer insulating film 14 is formed. In the interlayer insulating film 14, a groove section reaching the contact plug 13 is made. A wire 15 is buried in the groove section. These realize a MOS device structure of one conductivity type constituting, for example, a CMOS device. That is, although not shown, combining such a MOS device structure of the p-type with that of the n-type produces a COMS device structure.

Figure 2A:
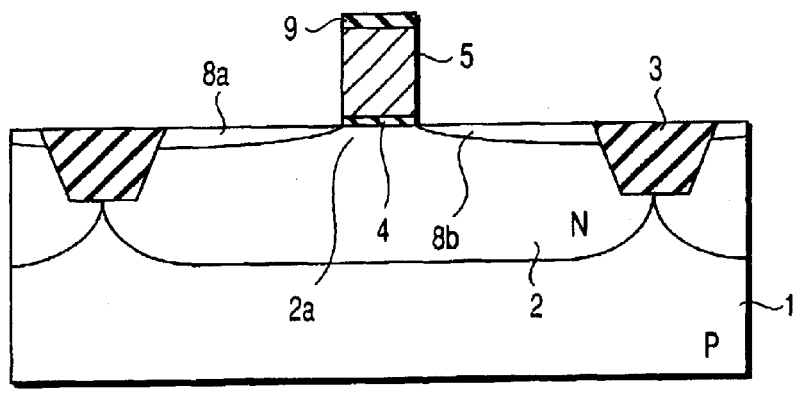
FIGS. 2A to 2D are sectional views to help explain the processes in a method of manufacturing the semiconductor device of the first embodiment.

Using sectional views of processes in FIGS. 2A to 2D, a method of manufacturing a semiconductor device of the first embodiment shown in FIG. 1 will be explained. First, as shown in FIG. 2A, for example, 350-nm-deep groove sections are made in the p-type silicon substrate 1. The element isolation insulating films 3 made of a silicon nitride film are buried in the groove sections by a buried element isolating method, thereby forming element isolation regions. Then, n-type impurities, such as phosphorus, are ion-implanted into the regions where the element isolation insulating films 3 have not been formed and onto the silicon substrate 1. Then, using active RTA, an n-type well 2 is formed to a specific depth. The condition for the ion implantation is, for example, at 500 Kev with a dose of $3.0 \times 10^{13}$ cm$^{-2}$.

In the adjacent active region, a well of the opposite conductivity type, for example, the p-type is formed. The condition for ion implantation of, for example, boron into the p-type well is at 260 KeV with a dose of $2.0 \times 10^{13}$ cm$^{-2}$.

After the formation of the well 2, for example, boron is ion-implanted to a specific depth from the surface of the silicon substrate 1 to form a region that is to function as a channel. The condition for the ion implantation is, for example, at 50 KeV with a dose of $1.5 \times 10^{13}$ cm$^{-2}$. Thereafter, using active RTA, the impurities are diffused, thereby forming a channel region 2a.

Then, by thermal oxidation techniques or LPCVD techniques, a gate insulating film 4 is formed to a thickness of, for example, 1.5 nm to 6.0 nm. On the gate insulating film 4, a gate electrode 5 made of, for example, polysilicon is formed to a thickness of, for example, 100 nm to 200 nm. Furthermore, on the gate electrode 5, a silicon oxide film 9 is formed to a thickness of 20 nm to 70 nm, preferably about 20 nm, by LPCVD techniques.

The gate insulating film 4 may be not only a silicon oxide film but also SiON, SiN, or $Ta_2O_5$, high dielectric material. The gate electrode 5 may be made of not only polysilicon but also a metal gate structure using W with TiN and WN as a barrier metal.

Thereafter, using photolithography, X-ray lithography, or electron-beam lithography, a resist mask is formed, leaving the gate insulating film 4, gate electrode 5, and silicon oxide film 9, for example, 50 nm to 150 nm in width. Then, etching is done by reactive ion etching (RIE) techniques. This forms a stacked structure composed of the gate insulating film 4, gate electrode 5, and silicon oxide film 9 each with a gate length of 50 nm to 150 nm, on the semiconductor substrate 1. The silicon oxide film 9 functions as a cap material in growing a silicon film 11 formed later at the upper part of the sidewall of the gate electrode 5.

Next, with the gate electrode 5 as a mask, ions are implanted into the element forming region where the element isolation insulating film 3 has not been formed, thereby forming low-concentration diffused layers 8a and 8b. In the case of n-type diffused layers, boron is ion-implanted at 1 to 5 Kev in a dose range from $5.0 \times 10^{14}$ cm$^{-2}$ to $1.0 \times 10^{15}$ cm$^{-2}$. In the case of p-type diffused layers, $BF_2$ is ion-implanted at 1 to 3 Kev in a dose range from $5.0 \times 10^{14}$ cm$^{-2}$ to $1.0 \times 10^{15}$ cm$^{-2}$. After the ion implantation, active RTA is performed.

Figure 2B:
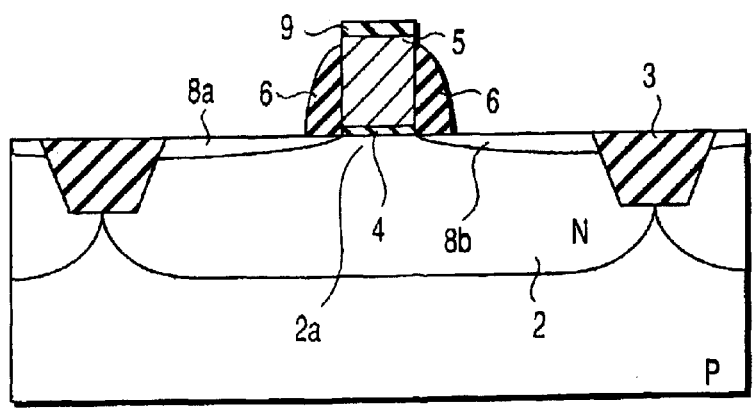

Then, as shown in FIG. 2B, a silicon nitride film is deposited on the whole surface of the device by LPCVD techniques. The silicon nitride film is etched back by reactive ion etching (RIE) techniques or the like. The etch-back process is continued until the height of the top surface of the silicon nitride film formed on the sidewall of the gate electrode 5 has become lower than that of the top surface of the gate electrode 5. This allows the upper part of the sidewall of the gate electrode 5 etched back earlier to be exposed from the silicon nitride film and thereafter the surface of the diffused layers 8a and 8b to be exposed, causing the gate sidewall insulating film 6 to remain on the sidewall of the gate electrode 5. It is desirable that the silicon oxide film 9 should have such a thickness as remains even after the upper part of the sidewall of the gate electrode 5 has been exposed by etch-back.

In etching back the silicon nitride film, silicon is exposed to RIE at the surface of the diffused layers 8a and 8b. This permits damage layers or carbon layers to get mixed with the diffused layers 8a and 8b. Thus, it is desirable that damage to the surface of the diffused layers 8a, 8b should be removed by oxidizing the substrate surface by RIE using $O_2$ gas and then eliminating the oxidized surface portion using dilute fluoric acid. It is further desirable that the silicon oxide film 9 should have such a thickness as remains after the surface of the diffused layers 8a and 8b has been processed.

Figure 2C:
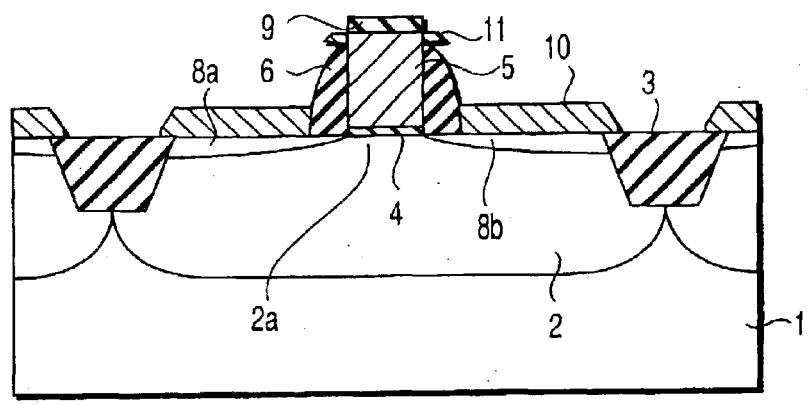

Next, after the surface of the silicon substrate 1 is subjected to high-temperature processing in an atmosphere of hydrogen to remove the natural oxidation film, monocrystalline epitaxial growth is performed at the surface of the silicon substrate 1 as shown in FIG. 2C. Specifically, the device is heated in an atmosphere of hydrogen at a high temperature higher than 800° C. and the reactive gas, such as $SiH_4$, $SiH_2Cl_2$, or $SiHCl_3$, is supplied together with hydrogen to the device. As a result, the silicon film 11 is formed horizontally at the part where the polycrystalline silicon of the gate electrode, that is, at the upper part of the sidewall of the gate electrode 5. Furthermore, the silicon film 10 is formed on the diffused layers 8a and 8b.

Figure 9:
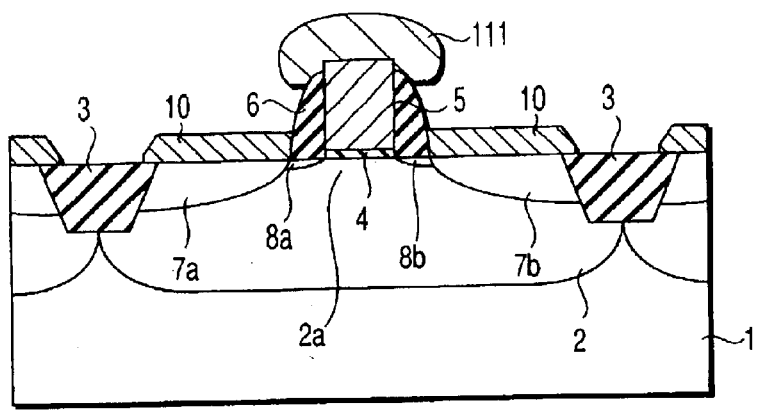
FIG. 9 is a sectional view to help explain a problem of the gate structure of a conventional semiconductor device.
Figure 10:
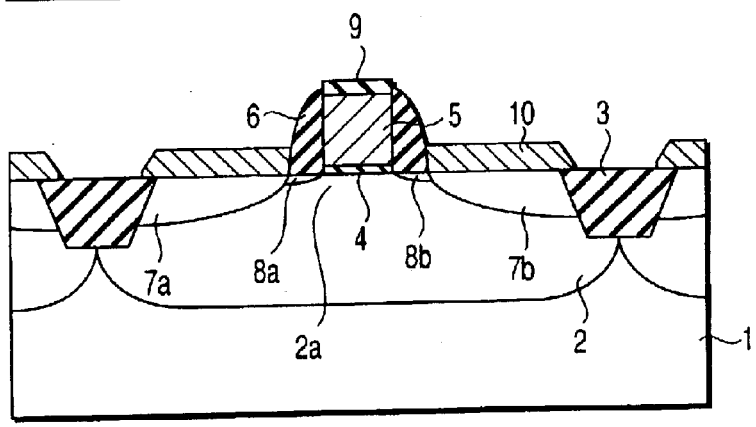
FIG. 10 is a sectional view to help explain another problem of the gate structure of the conventional semiconductor device.

On the top surface of the gate electrode 5, the silicon oxide film 9 is remained as a cap material. The remaining silicon oxide film 9 prevents silicon from growing on the top surface of the gate electrode 5. Consequently, silicon is prevented from growing into the shape of a mushroom as in the conventional manufacturing method shown in FIG. 9, eliminating the danger of short-circuiting with the silicon film 10. Therefore, there is no possibility that the gate electrode structure of the present embodiment will be short-circuited with the source-drain region.

Only the upper part of the sidewall of the gate electrode 5 is exposed. At its lower part, a silicon nitride film is provided as the gate sidewall insulating film 6. This allows silicon to grow only from the exposed upper part of the gate electrode 5. As a result, silicon grows from the sidewall of the gate in the directions of gate length and gate width. That is, silicon selectively grows only horizontally, or in the direction of gate length as shown in FIG. 2C and also in the direction of gate width perpendicular to the direction of the gate length. This growth in the horizontal direction is based on the fact that the epitaxial growth rate on the polycrystalline silicon is so fast than that of the silicon nitride film 6 or the silicon oxide film 9.

In the epitaxial growth device used for selective epitaxial growth, the shape of the reactive chamber may be of the upright type, the barrel type, or the cluster type. The heating system may be of the resistance heating type, the high-frequency heating type, or the lamp heating type. The wafer processing system may be of the sheet type or the batch type. This epitaxial growth may be performed after the formation of high-concentration diffused layers 7a and 7b explained later.

Figure 2D:
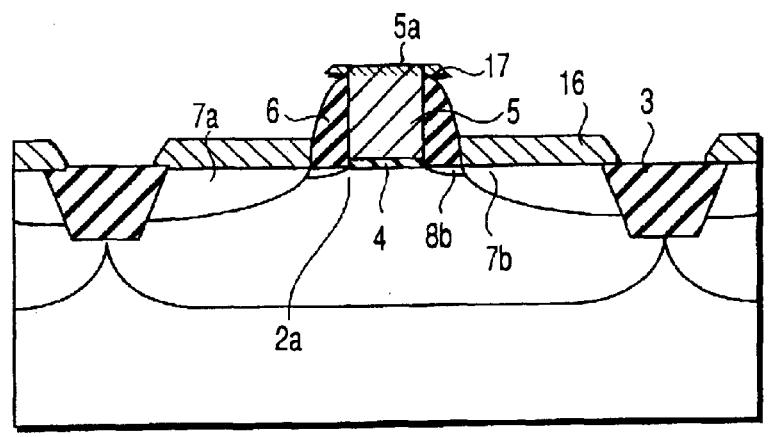

Through the process of such epitaxial growth, a T-shaped gate structure as shown in FIGS. 2C and 2D is obtained. The T-shaped structure is such that the gate electrode 5 is formed in the direction perpendicular to the surface of the silicon substrate 1 and the silicon film 11 extends from the upper part of the sidewall of the gate electrode 5 in the direction of gate length. Both of the gate electrode 5 and silicon film 11 are conductive and as a whole function as a gate electrode structure. This gate electrode structure makes it possible to realize a MOSFET structure with high resistance to the short-circuiting of the gate electrode with the source-drain region, that is, high bridging resistance. Therefore, even when the gate electrode 5 has a fine-wire structure, the silicide sheet resistance of the silicide layer 17 on the gate electrode 5 can be made low as will be explained below.

Then, as shown in FIG. 2D, after the silicon oxide film 9 is took off from the upper surface of the gate electrode 5, using the gate structure including the gate sidewall insulating film 6 as a mask, ions are implanted from above the silicon film 10 and silicon film 11, thereby forming high-concentration diffused layers 7a and 7b to a specific depth from the surface of the silicon substrate 1. Then, the silicon film 10 and silicon film 11 are performed in a silicide formation process using Ti, Co, or Ni, thereby forming the silicide films 16 and 17 as well as a silicide region 5a vat the top surface region of the gate electrode 5, which produces a MOSFET device with an ESD structure.

After the process of FIG. 2D, TEOS, BPSG, or SiN is deposited. Then, CMP is performed for forming an interlayer insulating film 12. In the interlayer insulating film 12, contact holes are made by the processes including resist application, exposure, and patterning, and by such etching as RIE, in such a manner that the silicide film 16 is exposed in the contact holes.

Then, such barrier metals as Ti and TiN are deposited so as to cover the surface of the opening of the contact holes, followed by a selective growth of such metal material as W or the formation of the metal material into a blanket. Thereafter, if necessary, flattening is done by CMP, thereby forming contact plugs 13. Furthermore, an interlayer insulating film 14 is formed on the contact plugs 13. In the interlayer insulating film 14, groove sections are made and wires 15 to be connected to the contact plug 13 are formed, which completes a MOSFET device. Of course, the contact plugs 13 and wires 15 may be formed by a dual-damascene process.

As described above, with the first embodiment, the silicon oxide film 9 formed in advance as a cap material on the top surface of the gate electrode 5 is taken off and silicide forming process is performed, thereby forming silicide films 16 and 17. In the same time, the top surface region is also transformed as the silicide region 5a. The lower part of the sidewall of the gate electrode 5 is covered with the gate sidewall insulating film 6 so that only the upper part of the sidewall may be exposed. This allows silicon to grow epitaxially only from the upper part of the sidewall of the gate electrode 5, thereby realizing a T-shaped gate structure.

Figure 3:
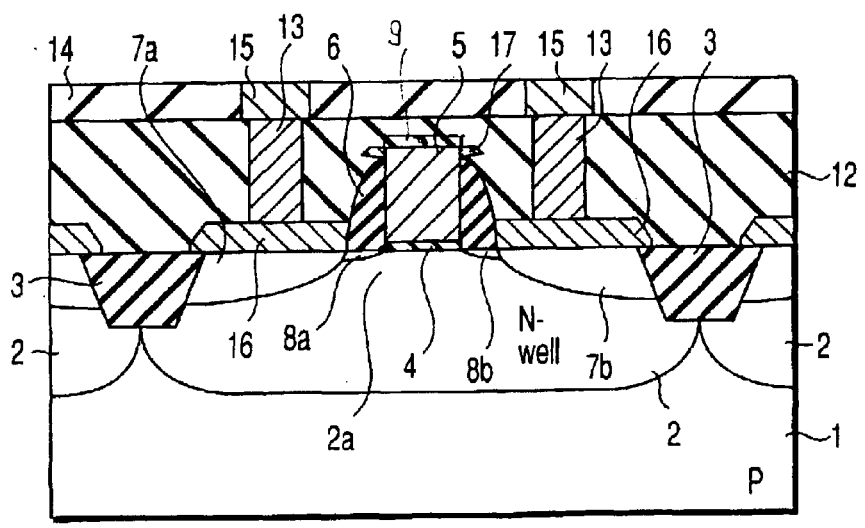
FIG. 3 is a sectional view showing a configuration of a semiconductor device-according to a modification of the first embodiment.

Though the silicon oxide film 9 is taken off to expose the top surface of the gate electrode 5 before the silicide formation process is performed as shown in FIG. 2D, it is possible to perform this silicide formation process without taking off the silicon oxide film 9 in a modification of the first embodiment. In this case, as shown in FIG. 3, the silicon oxide film 9 is remained in the final product.

While in the first embodiment, the silicon film 11 is grown epitaxially at the exposed part of the upper part of the sidewall of the gate electrode 5 made of polycrystalline silicon, a silicon-germanium (Si—Ge) film made of a different material from that of the polysilicon gate electrode 5 may be grown epitaxially in place of silicon.

When the gate electrode is made of polycrystalline silicon, the epitaxial film grown horizontally at the exposed upper part of the sidewall of the gate electrode may be formed of a polycrystalline silicon film or a silicon germanium film. In this case, the sidewall insulating film formed at the lower part of the sidewall of the gate electrode is made of, for example, a silicon nitride film whose epitaxial growth rate is lower than that of polycrystalline silicon or silicon germanium.

This makes it easier to selectively grow a polycrystalline silicon layer or a silicon germanium layer in the direction of gate length from the exposed upper part of the sidewall of the gate electrode 5.

Furthermore, with the upper part of the sidewall of the gate electrode being exposed, a first sidewall film whose silicon epitaxial growth rate is high can be formed in contact with a sidewall of the gate electrode and a second sidewall film whose silicon epitaxial growth rate is lower than that of the first sidewall film can be formed in contact with the first sidewall film in such a manner that the exposed part of the top surface of the first sidewall film is not covered with the second sidewall film.

With this configuration, a polycrystalline silicon layer or a silicon germanium layer is also formed horizontally from the exposed upper part of the sidewall of the gate electrode 5 in the same manner as in the first embodiment. In addition, the amount of its growth can be controlled as will be explained in detail.

Specifically, selective epitaxial growth can be performed by suppressing the process condition to the extent that the silicon film or silicon germanium film grows horizontally on the exposed upper part of the gate electrode only at the part in contact with the first sidewall film. Controlling particularly the thickness of the first sidewall film makes it possible to control the amount of growth of the silicon film or silicon germanium film in the horizontal direction, or in the direction of gate length.

It is more preferable that the first sidewall film should be made of a material with a high nitrogen content and the second sidewall film be made of a material with a lower nitrogen content than that of the first sidewall film. The reason is that the higher the nitrogen content, the faster the silicon epitaxial growth rate tends to be. The above-mentioned structure will be explained in detail in the following second embodiment.

(Second Embodiment)

A second embodiment of the present invention uses a modification of the sidewall insulating film used in the first embodiment. The second embodiment is characterized in that, to realize the same T-shaped gate structure as in the first embodiment, the upper part of the sidewall of the gate electrode 5 is exposed and the sidewall of the gate electrode 5 is covered with a first sidewall film made of a material whose silicon epitaxial growth is fast, with the exposed part left as it is, and that, on the first sidewall film, a second sidewall film whose epitaxial growth is slow is formed, thereby increasing the controllability of the extent of the epitaxial growth of the epitaxial film formed on the exposed part of the gate electrode 5.

In the second embodiment, the same parts as those in the first embodiment are indicated by the same reference numerals and a detail explanation of them will be omitted.

Figure 4:
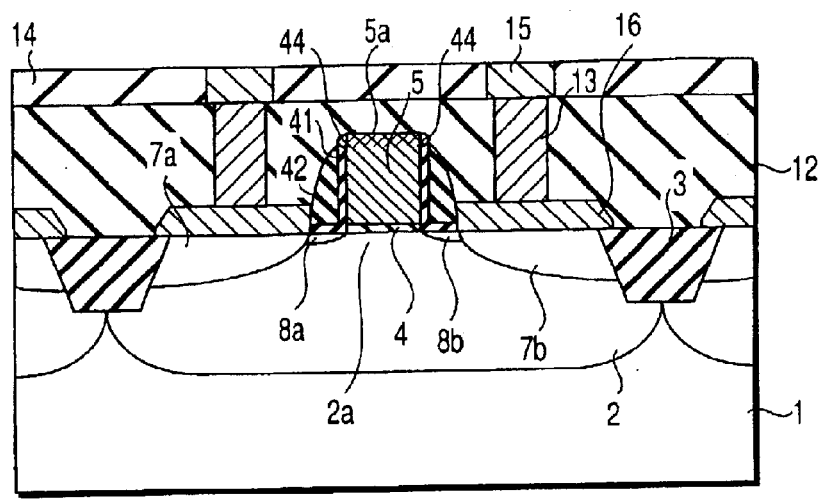
FIG. 4 is a sectional view showing a configuration of a semiconductor device according to a second embodiment of the present invention.

FIG. 4 is a longitudinal sectional view showing the configuration of a semiconductor device according to the second embodiment. In the first embodiment, the gate sidewall insulating film 6 of FIG. 1 is formed only at the lower part of the sidewall of the gate electrode. The second embodiment differs from the first embodiment in that a two-layer film structure of a silicon nitride sidewall film 41 and a silicon oxide sidewall film 42 is formed on the sidewall of the gate electrode 5 excluding the exposed part of the upper part of the sidewall of the gate electrode 5. Furthermore, the former differs from the latter in the structure of a silicide film 44 formed adjacent to the silicon nitride sidewall film 41 to have a height in the horizontal direction similar to the thickness of the silicon nitride sidewall film 41, at the silicide region 5a formed at the upper exposed part of the sidewall of the gate electrode 5.

Figure 5A:
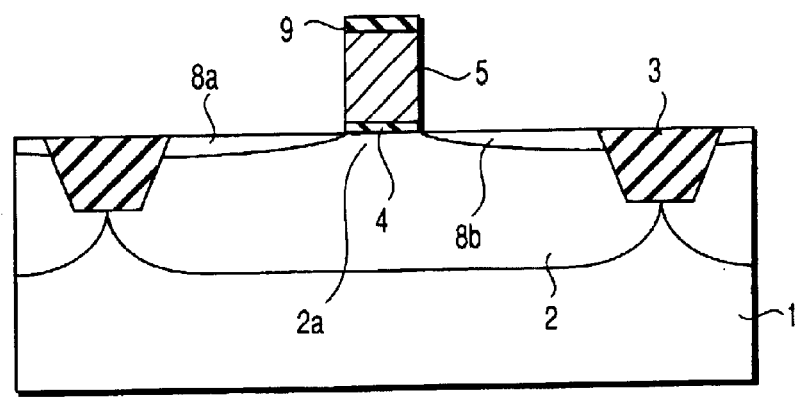
FIGS. 5A to 5D are sectional views to help explain the processes in a method of manufacturing the semiconductor device of the second embodiment.

In the second embodiment, a gate insulating film 4 and a gate electrode 5 are formed in a stacked manner on the silicon substrate 1 as shown in FIG. 5A. The processes up to this point are the same as those in FIG. 2A. The silicon oxide film 9 formed on the gate electrode 5 is subjected to post-oxidation using thermal oxidation techniques. Its film thickness is set to, for example, 2 nm to 6 nm.

Figure 5B:
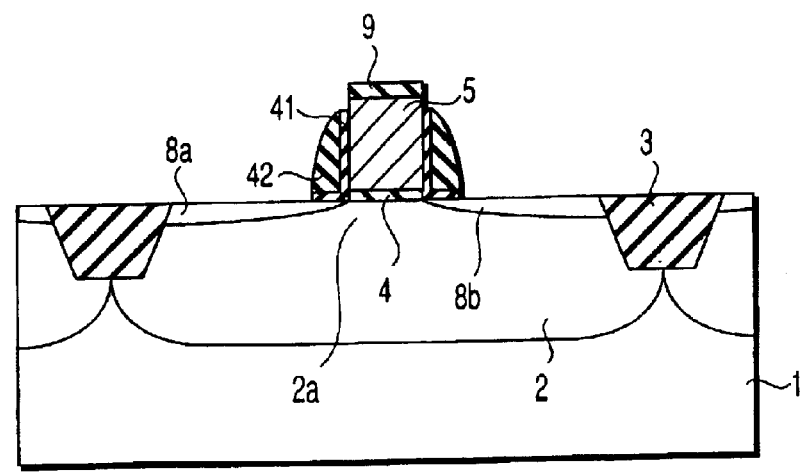

Then, as shown in FIG. 5B, a silicon nitride sidewall film 41 is formed to a thickness of, for example, 10 nm to 50 nm, preferably 10 nm to 20 nm, over the area ranging from the sidewall of the gate electrode 5 to the surface of the silicon substrate 1, using LPCVD techniques. Then, a silicon oxide film 42 is formed over the entire surface of the device including the silicon nitride sidewall film 41. Thereafter, the silicon nitride sidewall film 41 and silicon oxide film 42 are etched back by reactive ion etching (RIE). As a result, the silicon nitride sidewall film 41 is so formed to cover not only the surface of the sidewall excluding the exposed part of the upper part of the sidewall of the gate electrode 5 but also the surface of the diffused layers 8a and 8b a specific distance from the gate electrode 5 in the direction of gate length. This causes the silicon nitride sidewall film 41 and the silicon oxide sidewall film 42 on the film 41 to remain excluding the exposed part of the upper part of the sidewall of the gate electrode 5.

Like the silicon nitride sidewall film 41, the silicon oxide sidewall film 42 is formed so as to extend from the gate electrode 5 a specific distance in the direction of gate length and not to cover the top part of the silicon nitride sidewall film 41. Consequently, the top surface of the silicon nitride sidewall film 41 is adjacent to the exposed part of the upper part of the sidewall of the gate electrode 5.

Specifically, the etch-back of the nitride sidewall film 41 and oxide sidewall film 42 makes the upper part of the silicon nitride sidewall film 41 and silicon oxide sidewall film 42 lower than the top surface of the gate electrode 5, which causes the upper part of the sidewall of the gate electrode 5 adjacent to the top surface thereof to be exposed. The silicon oxide film 9 formed on the top surface of the gate electrode 5 has to be set to a thickness that allows the film 9 to be remained only at the top surface of the gate electrode 5 with a specific thickness by etch-back.

Figure 5C:
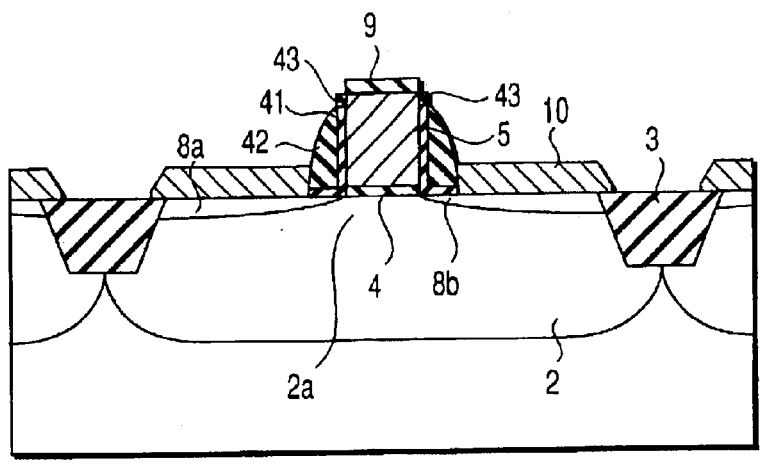

Next, as shown in FIG. 5C, silicon is grown epitaxially at the exposed part of the upper part of the sidewall of the gate electrode 5, thereby forming a silicon film 43. At the same time, a mono-crystalline silicon film 10 is formed on the diffused layers 8a, 8b.

In the second embodiment, the gate sidewall except for the upper exposed portion is covered with the silicon nitride sidewall film 41 and silicon oxide sidewall film 42. The silicon nitride sidewall film 41 presents better wetting in silicon epitaxial growth than the silicon oxide sidewall film 42. Therefore, the silicon nitride sidewall film 41 allows the silicon film 43 to grow epitaxially easier than the silicon oxide film 42. Making use of this property, it is possible to control the amount of growth of the silicon film 43 growing at the exposure part of the upper part of the gate electrode 5 in the direction of gate length, or in the horizontal direction of FIG. 4C, according to the thickness of the silicon nitride sidewall film 41.

Specifically, silicon grows from the polysilicon part exposed at the upper part of the sidewall of the gate electrode 5. In the course of growth, silicon grows in the direction of gate length along the part where the top part of the silicon nitride sidewall film 41 is exposed. When the silicon has reached at the boundary between the silicon nitride sidewall film 41 and the silicon oxide sidewall film 42, the horizontal growth of the silicon film 43 stops.

In other words, controlling the thickness in the direction of gate length of the silicon nitride sidewall film 41 enables the amount of growth of the silicon film 43 to be controlled. Of course, silicon grows a little on the silicon oxide sidewall film 42. Making use of the difference in the amount of growth between the silicon nitride sidewall film 41 and the silicon oxide sidewall film 42, however, the process window related to the growth condition is improved by combining the silicon nitride sidewall film whose silicon epitaxial growth rate is relatively fast with the silicon oxide sidewall film 42 whose silicon epitaxial growth rate is slow.

Figure 5D:
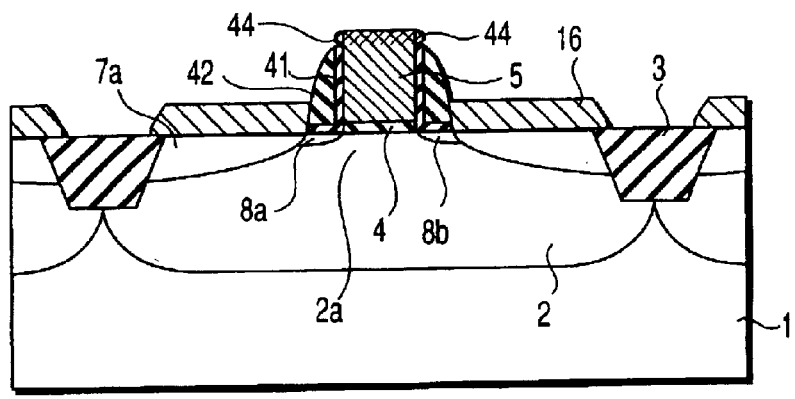

As shown in FIG. 5D, after the silicon oxide cap 9 is removed completely, with the gate structure including the gate sidewall insulating films 41, 42 as a mask, ions are implanted into the silicon films 10, forming high-concentration diffused layers 7a, 7b to a specific depth from the surface of the silicon substrate 1. After that, the silicon film 10 and silicon film 43 as well as the exposed top region of the gate electrode 5 are processed in a silicide forming step using Ti, Co, or Ni, thereby forming silicide films 16 and 44 and silicide region 5a. This produces a T-shaped gate MOSFET with an ESD structure.

The subsequent manufacturing processes of interlayer insulating films 12, 14, contact plugs 13, and wires 15 are the same as those in the first embodiment. Through these processes, the MOS device shown in FIG. 4 is realized.

Figure 6:
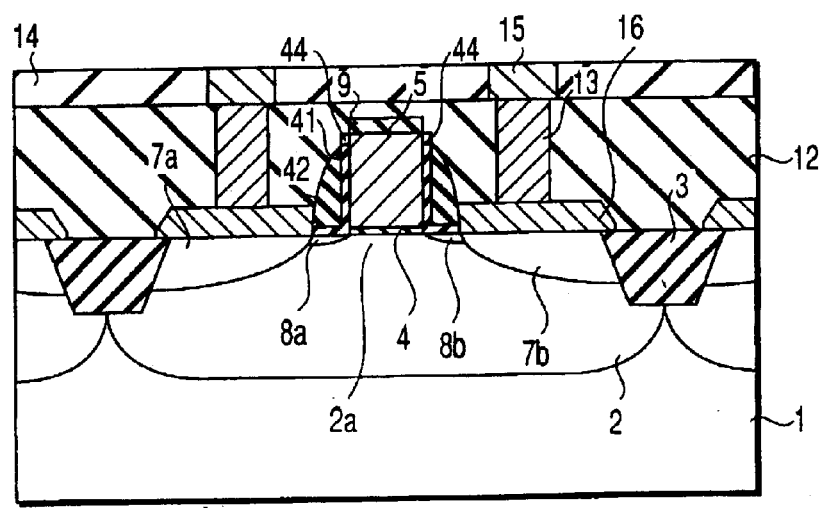
FIG. 6 is a sectional view showing a configuration of a semiconductor device according to a modification of the second embodiment of the present invention.

At the manufacturing step shown in FIG. 5D, the silicon oxide cap 9 is removed before performing the ion implantation process and silicide formation process, it is also possible to realize a gate structure as shown in FIG. 6, in which the silicon oxide cap 9 is remained at the top of the gate electrode 5. In this case, the silicide region 5a shown in FIG. 5D is not formed.

As described above, the second embodiment can not only realize the same T-shaped gate structure as that in the first embodiment but also control the amount of growth of the silicon film 43. This increases the controllability of the form of the T-shaped gate structure.

Preferably, the first insulating film 41 is made of a material with a high nitrogen content and the second insulating film 42 is made of a material with a lower nitrogen content than that of the first insulating film 41. It is more preferable that the first insulating film 41 is a silicon nitride film, the second insulating film is a silicon oxide film 42, and the gate electrode 5 is made of polysilicon.

When a salicide process is used for making the silicide films 16 and 17 as well as the silicide region 5a in the first or second embodiment, it is desirable that the silicon oxide film 9 formed at the top of the gate electrode 5 should be removed completely using dilute fluoric acid. The silicide films used in the present invention may be of a silicide of any metal.

Also, while silicon film is grown epitaxially simultaneously on the surface of the silicon substrate 1 and the sidewall of the gate electrode 5, it may be grown only on the sidewall of the gate electrode 5.

(Third Embodiment)

Figure 7:
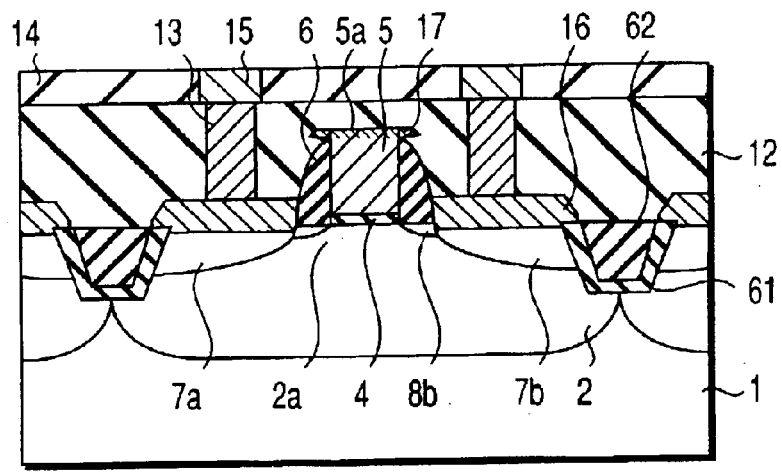
FIG. 7 is a longitudinal sectional view showing the overall configuration of a semiconductor device according to a third embodiment of the present invention.

FIG. 7 is a longitudinal sectional view showing the configuration of a semiconductor device according to a third embodiment of the present invention. The third embodiment is characterized in that two layers of insulating films formed of different material are used in the element isolation region and the growth of the silicon film 10 facing the element isolation region can be controlled.

Figure 8A:
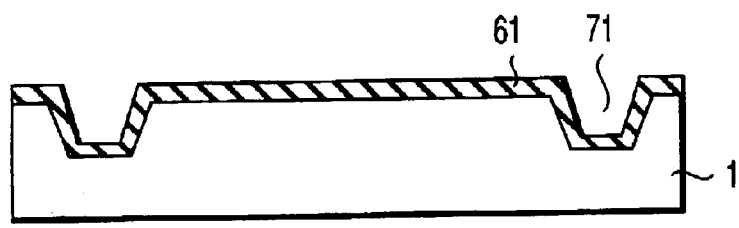
FIGS. 8A to 8F are sectional views to help explain the processes in a method of manufacturing the semiconductor device of the third embodiment.

As shown in FIG. 7, a silicon nitride film 61 is formed to a thickness of, for example, 20 nm to 50 nm, preferably 20 nm to 30 nm in such a manner that the film 61 covers the surface of groove sections 71 shown in FIG. 8A with a specific depth from the surface of the silicon substrate 1. In the groove sections 71 defined by the silicon nitride film 61, a silicon oxide film 62 is formed so as to fill up the grooves. The third embodiment is characterized in that a silicide film 16 is formed so as to cover the part ranging from the gate sidewall insulating film 6 to part of the silicon nitride film 61 on the silicon substrate 1.

Hereinafter, using the sectional views of steps in FIGS. 8A to 8F, the manufacturing processes of the third embodiment will be explained.

Figure 8B:
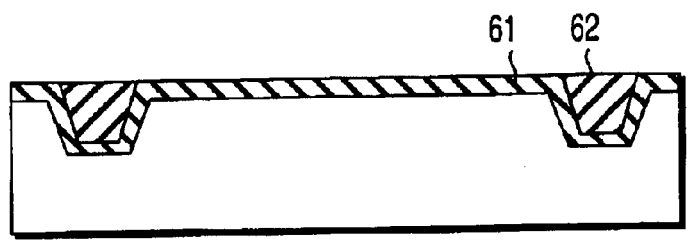

As shown in FIG. 8A, a plurality of groove sections 71 are made in the silicon substrate 1. A silicon nitride film 61 is deposited to a thickness of 20 nm to 50 nm in such a manner that it covers the bottom and side of the groove sections 71 and the surface of the silicon substrate 1. Next, as shown in FIG. 8B, a silicon oxide film 62 is deposited on the whole surface of the silicon substrate 1 including the inside of the groove section 71 defined by the silicon nitride film 61 to fill up the groove section 71. The silicon oxide film 62 is flattened and removed by CMP or the like, thereby remaining a silicon oxide film 62 only in the groove sections 71. This produces a two-layer structure of the silicon nitride film 61 and silicon oxide film 62 in the groove sections 71. At the surface of the groove sections 71, the silicon nitride film 61 is exposed at the boundary region between the groove section 71 and the silicon substrate 1 and the silicon oxide film 62 is exposed inside the silicon nitride film 61 in the groove sections 71.

Figure 8C:
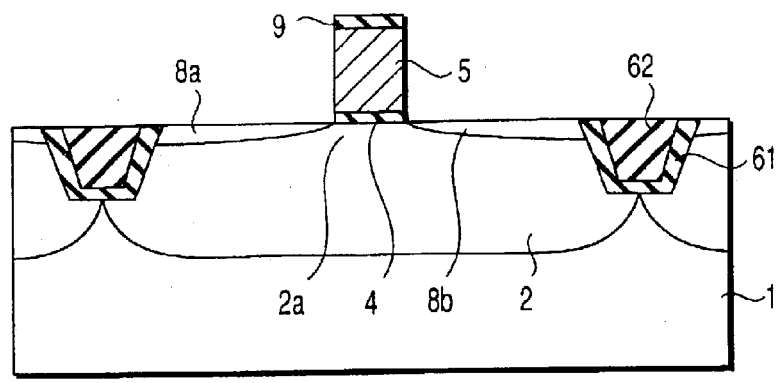

Then, as shown in FIG. 8C, a well 2 and a channel region 2a are formed in the silicon substrate 1, a gate insulating film 4, a gate electrode 5, and a silicon oxide film 9 are selectively formed in an active region, and then diffused layers 8a, 8b are formed at the exposed surface of the silicon substrate 1 by the same method as in the first or second embodiment.

Figure 8D:
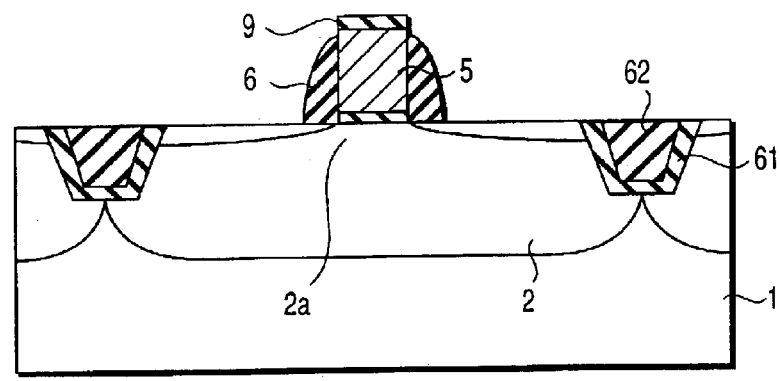

Next, as shown in FIG. 8D, a gate sidewall insulating film 6 is formed on the sidewall of the gate electrode 5 by the same method as in the first embodiment in such a manner that the upper part of the sidewall of the gate electrode 5 is exposed.

Figure 8E:
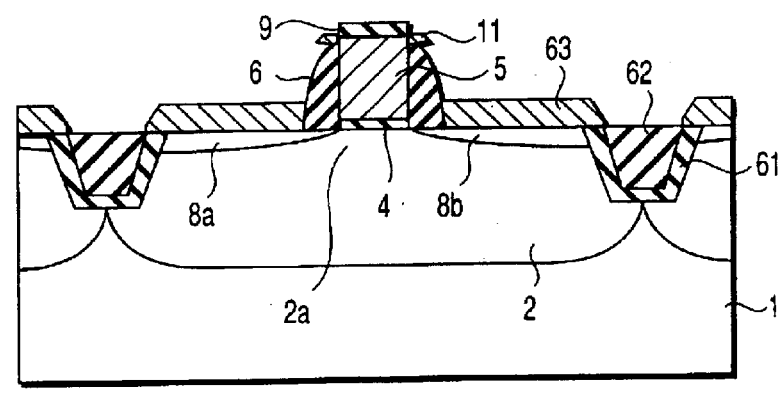

Then, as shown in FIG. 8E, a silicon film 11 and a silicon film 63 are formed. The growth of the silicon film 11 is the same as in the first embodiment. The silicon film 63 is formed so as to extend from the gate sidewall insulating film 6 on the exposed silicon nitride film 61 and reaching to the edge of the exposed silicon oxide film 62 at the surface of the silicon substrate 1.

In this way, the silicon film 63 is formed so as to run reliably only onto the silicon nitride film 61 serving as a part of an element isolation insulating film. This makes use of the fact that the silicon nitride film 61 presents better wetting in silicon epitaxial growth than the silicon oxide film 62. Because of the difference in wetting, the silicon epitaxial growth rate on the silicon nitride film 61 is higher than on the silicon oxide film 62.

If an element isolation region is made of only the silicon nitride film 61, there is a possibility that the silicon film 63 will extend close to the center of the element isolation region due to slight fluctuations in the process condition. Such fluctuations in the process condition will cause a possibility that the silicon films 63 of the adjacent transistors will be short-circuited with each other.

On the other hand, when an element isolation region is made of only the silicon oxide film 62, since the silicon oxide film 62 presents low wetting, the silicon film 63 does not run onto the surface of the element isolation region, resulting in the disadvantages of the prior art explained by reference to FIG. 11B.

In contrast, when an element isolation region is formed using the silicon nitride film 61 and silicon oxide film 62 as in the third embodiment, the silicon film 63 runs easily onto the silicon nitride film 61. Then, the silicon oxide film 62 acts as a stopper, thereby effectively preventing the silicon films 63 of the adjacent transistors from being short-circuited.

Figure 8F:
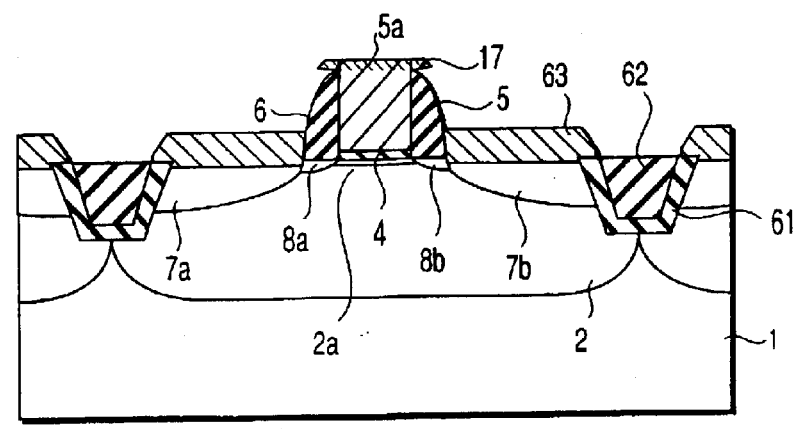

Then, as shown in FIG. 8F, after the silicon oxide cap 9 is removed, with the gate structure including the gate sidewall insulating film 6 as a mask, ions are implanted from above the silicon film 63, thereby forming high-concentration diffused layers 7a, 7b to a specific depth from the surface of the silicon substrate 1.

Then, the silicon film 63 and silicon film 11 are silicified using Ti, Co, or Ni, thereby forming silicide films 16 and 17 and silicide region 5a. This produces a MOSFET with an ESD structure. The subsequent manufacturing processes of interlayer insulating films 12, 14, contact plugs 13, and wires 15 are the same as those in the first embodiment. Through these processes, the MOS device shown in FIG. 7 is realized.

Figure 11A:
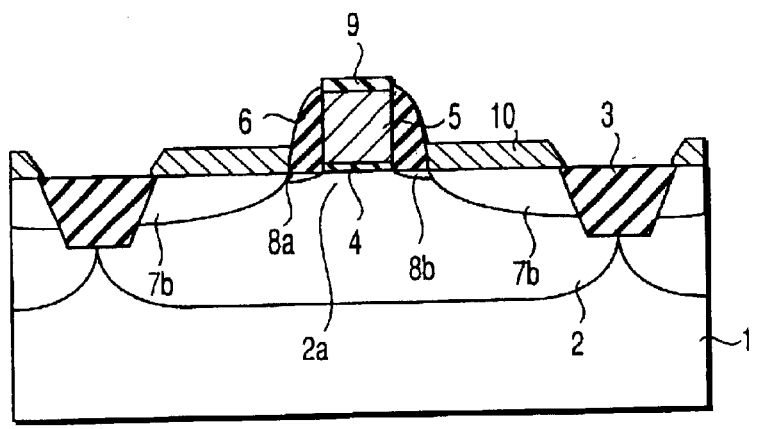
FIGS. 11A and 11B are sectional views to help explain a problem of the silicide film extending into the element isolation region of the conventional semiconductor device.
Figure 11B:
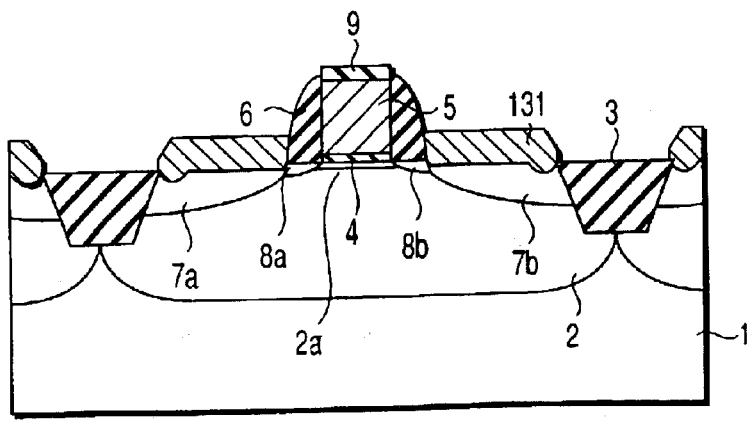

Furthermore, at the boundary between the silicon substrate 1 and the element isolation region, after a silicide formation process using the silicon film 63, the edge of the silicide film 16 is prevented from being extended to a deep position from the surface of the substrate 1 unlike the prior art shown in FIG. 11B. Such an effect is noticeable when the isolation zone of the element isolation region becomes less width.

The present invention is not limited to the above embodiments. While the controllability of silicon epitaxial growth is improved on the basis of the difference in wetting between the silicon oxide film and the silicon nitride film in the second and third embodiments, the invention is not restricted to such materials. For instance, the silicon oxide film may include nitrogen or the silicon nitride film may include oxygen, provided that the silicon nitride film has a higher nitrogen content than the silicon oxide film. Therefore, both of the silicon oxide film and silicon nitride film may be realized using a silicon oxide nitride film. To realize these films using a silicon oxide nitride film, the structure corresponding to the silicon nitride film has only to have a higher nitrogen content than the structure corresponding to the silicon oxide film.

Furthermore, combining materials of different in silicon epitaxial growth rate enables the best T-shaped gate structure or the silicide structure on the diffused layers to be obtained.

While in the second and third embodiments, the amount of silicon epitaxial growth is controlled by two types of materials differing in epitaxial growth rate, the amount of growth may be controlled by three or more materials differing in epitaxial growth rate.

In addition, while the first and second embodiment have disclosed the mode of controlling the epitaxial growth of a silicon film on the sidewall of the gate electrode and the third embodiment has disclosed the mode of controlling the epitaxial growth of a silicon film extending from the diffused layer to the element isolation insulating film, these two modes may, of course, be combined. Further, in any one of described embodiments, it is also possible to control the epitaxial growth rate of the silicon-germanium film instead of the silicon film.

As has been described in detail, with the present invention, a T-shaped gate structure can be realized. Furthermore, the present invention enables a shape of a silicide film to be made with a high controllability. Therefore, it is possible to realize a T-shaped gate structure that avoids an ion implantation problem and the problem of the short-circuiting between the gate electrode and the source region or drain region in a CMOS device with an ESD structure and its manufacturing processes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a silicon semiconductor substrate;
   a groove section formed to a specific depth from a surface of the semiconductor substrate so as to separate the silicon semiconductor substrate into a plurality of regions;
   an element isolation region which is formed by burying at least a first and second insulating films differing in silicon epitaxial growth rate sequentially in the groove section and which defines element forming regions on said silicon semiconductor substrate, the first insulating film including a portion exposed along a boundary region defined between a surface of the element insolation region and a surface of the element forming region, and the second insulating film is exposed inside the first insulating film in the element insolation region;
   a gate electrode selectively formed on a first region of the element forming region of the silicon semiconductor substrate defined by said element isolation region via a gate insulation film;
   a source region and a drain region formed in a second region of the element forming region of the surface of said silicon semiconductor substrate, said first region being sandwiched between the source region and the drain region; and
   a silicide film formed so as to cover from said source region and drain region to the first insulating film in said element isolation region of said silicon semiconductor substrate, wherein
   said first insulating film is made of a material whose silicon epitaxial growth rate is higher than that of said second insulating film.

2. The semiconductor device according to claim 1, wherein said first insulating film in said element isolation region is a film with a high nitrogen content and said second insulating film is a film with a lower nitrogen content than that of said first insulating film.

3. The semiconductor device according to claim 1, wherein said first insulating film is a silicon nitride film and said second insulating film is a silicon oxide film.

4. The semiconductor device according to claim 1, wherein said first insulating film has a thickness 20 nm to 50 nm.

5. The semiconductor device according to claim 1, further comprising:
   a sidewall insulating film formed on a lower part of a sidewall of said gate electrode except for an exposed part formed at an upper part of the sidewall and on a predetermined surface region of said silicon semiconductor substrate adjacent to said gate electrode; and
   an epitaxial film formed on said exposed part, the epitaxial film being not formed on a top surface of said gate electrode.

6. The semiconductor device according to claim 5, wherein said epitaxial film is a silicide film of a polycrystalline silicon film.

7. The semiconductor device according to claim 5, wherein said sidewall insulating film is a silicon nitride film.

8. The semiconductor device according to claim 5, wherein said sidewall insulating film includes a first sidewall film made of a material whose silicon epitaxial growth rate is high and a second sidewall film formed on the first sidewall film and made of a material whose silicon epitaxial growth rate is lower than that of said first sidewall film.

9. The semiconductor device according to claim 5, wherein said epitaxial film has a length 10 nm to 50 nm in a gate-length direction.

10. The semiconductor device according to claim 8, wherein said first sidewall film has a thickness 10 nm to 50 nm.

11. A semiconductor device comprising:
    a semiconductor substrate;
    a groove section formed in the semiconductor substrate;
    an element isolation region buried in the groove section which comprises a first insulating film formed in the groove section and a second insulating film formed on the first insulating film, the first insulating film including a portion exposed along a boundary region defined between a surface of the element isolation region and a surface of the element forming region, and the second insulating film is exposed inside the first insulating film in the element isolation region;
    a gate electrode selectively formed on a first region of an element forming region of the semiconductor substrate defined by the element isolation region via a gate insulation film;
    a source region and a drain region formed in a second region of the element forming region of a surface of the semiconductor substrate, the first region being sandwiched between the source region and the drain region; and
    a silicon film formed so as to cover an area from the source region and drain region to the first insulating film in the element isolation region of the semiconductor substrate.

12. A semiconductor device according to claim 11, wherein the first insulating film in the element isolation region is a film with a high nitrogen content and the second insulating film is a film with a lower nitrogen content than that of the first insulating film.

13. A semiconductor device according to claim 11, wherein the first insulating film is a silicon nitride film and the second insulating film is a silicon oxide film.

14. A semiconductor device according to claim 11, wherein the first insulating film has a thickness of 20 nm to 50 nm.

15. A semiconductor device according to claim 11, further comprising:
    a sidewall insulating film formed on a lower part of a sidewall of the gate electrode except for an exposed part formed at an upper part of the sidewall and on a predetermined surface region of the semiconductor substrate adjacent to the gate electrode; and
    an epitaxial film formed on the exposed part, the epitaxial film not being formed on a top surface of the gate electrode.

16. A semiconductor device according to claim 15, wherein the epitaxial film is a silicide film of a polycrystalline silicon film.

17. A semiconductor device according to claim 15, wherein the sidewall insulating film is a silicon nitride film.

18. A semiconductor device according to claim 15, wherein the sidewall insulating film includes a first sidewall film made of a material having a high silicon epitaxial growth rate and a second sidewall film formed on the first sidewall film and made of a material having a silicon epitaxial growth rate lower than that of the first sidewall film.

19. A semiconductor device according to claim 15, wherein the epitaxial film has a length of 10 nm to 50 nm in a gate-length direction.

20. A semiconductor device according to claim 18, wherein the first sidewall film has a thickness of 10 nm to 50 nm.

* * * * *

UNITED STATES PATENT AND TRADEMARK OFFICE
CERTIFICATE OF CORRECTION

PATENT NO. : 6,927,459 B2
DATED : August 9, 2005
INVENTOR(S) : Hokazono et al.

It is certified that error appears in the above-identified patent and that said Letters Patent is hereby corrected as shown below:

Column 15,
Lines 26-27 and 29, change "insolation region" to -- isolation region --.

Signed and Sealed this

Eighteenth Day of October, 2005

JON W. DUDAS
*Director of the United States Patent and Trademark Office*